(12) United States Patent
Sun et al.

(10) Patent No.: US 9,276,165 B2
(45) Date of Patent: Mar. 1, 2016

(54) COMPOSITE SUBSTRATE WITH A PROTECTIVE LAYER FOR PREVENTING METAL FROM DIFFUSING

(75) Inventors: Yongjian Sun, Beijing (CN); Guoyi Zhang, Beijing (CN); Yuzhen Tong, Beijing (CN)

(73) Assignee: Sino Nitride Semiconductor Co.Ltd, DongGuan (CN)

( * ) Notice: Subject to any disclaimer, the term of this patent is extended or adjusted under 35 U.S.C. 154(b) by 0 days.

(21) Appl. No.: 14/380,070

(22) PCT Filed: Jul. 23, 2012

(86) PCT No.: PCT/CN2012/079009
§ 371 (c)(1),
(2), (4) Date: Aug. 21, 2014

(87) PCT Pub. No.: WO2014/015458
PCT Pub. Date: Jan. 30, 2014

(65) Prior Publication Data
US 2015/0132542 A1    May 14, 2015

(51) Int. Cl.
| | |
|---|---|
| *B32B 3/00* | (2006.01) |
| *H01L 33/00* | (2010.01) |
| *H01L 33/44* | (2010.01) |
| *C30B 25/20* | (2006.01) |
| *C30B 29/40* | (2006.01) |
| *C30B 33/00* | (2006.01) |

(52) U.S. Cl.
CPC ............ *H01L 33/0075* (2013.01); *C30B 25/20* (2013.01); *C30B 29/406* (2013.01); *C30B 33/00* (2013.01); *H01L 33/44* (2013.01); *Y10T 428/24777* (2015.01)

(58) Field of Classification Search
CPC .............. Y10T 428/24777; Y10T 428/24851; H01L 21/02389; C30B 25/20; C30B 29/406; C30B 33/00
See application file for complete search history.

(56) References Cited

U.S. PATENT DOCUMENTS

| | | | | |
|---|---|---|---|---|
| 2008/0303032 A1* | 12/2008 | Dwilinski | ................. | C30B 9/00 257/76 |
| 2011/0012109 A1* | 1/2011 | Kryliouk | ............. | H01L 21/0237 257/49 |
| 2014/0357053 A1* | 12/2014 | Sun | ........................ | C30B 29/406 438/458 |
| 2014/0377507 A1* | 12/2014 | Zhang | ................... | H01L 33/007 428/172 |

\* cited by examiner

*Primary Examiner* — Elizabeth Mulvaney
(74) *Attorney, Agent, or Firm* — SV Patent Service

(57) ABSTRACT

The present application discloses a composite substrate with a protective layer for preventing metal from diffusing, comprising: a thermally and electrically conductive layer (2) having a melting point of greater than 1000° C., and a GaN mono-crystalline layer (1) located on the thermally and electrically conductive layer (2). At least the side wall of the composite substrate is cladded with a protective layer (3) for preventing metal from diffusing. The composite substrate not only takes account of the homoepitaxy required for GaN epitaxy and improves the quality of the crystals, but also can be used directly to prepare LEDs with vertical structures and significantly reduce costs. The disclosed composite substrate effectively avoids the pollution of experimental instruments by the diffusion and volatilization of a metal material during the growth of MOCVD at high temperature.

10 Claims, 8 Drawing Sheets

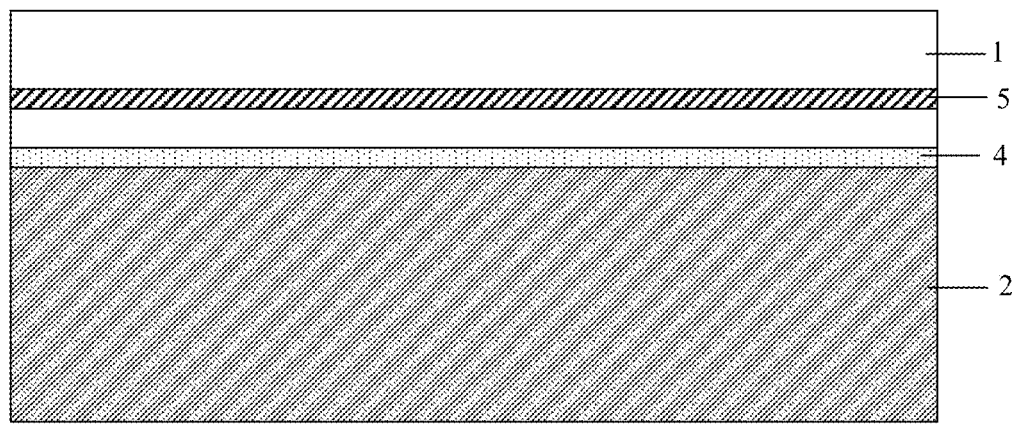
Fig. 8
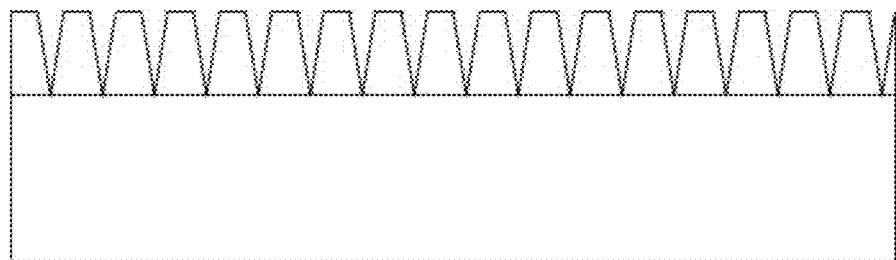
Fig. 9
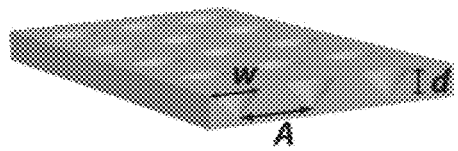   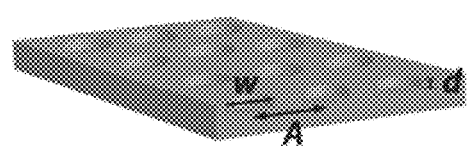
Fig. 10A            Fig. 10B
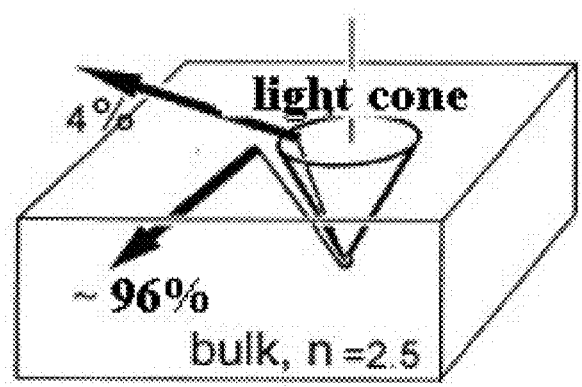
Fig. 11

COMPOSITE SUBSTRATE WITH A PROTECTIVE LAYER FOR PREVENTING METAL FROM DIFFUSING

BACKGROUND OF THE INVENTION

The present invention relates to a composite substrate used for GaN epitaxial growth, especially an efficient composite substrate with a protective layer for preventing metal from diffusing.

In recent years, III/V nitride materials, mainly GaN, InGaN, and AlGaN, have received much attention as semiconductor materials. The III/V nitride materials have direct band gaps that can be continuously varied from 1.9 to 6.2 eV, excellent physical and chemical stability, and high saturation electron mobility. They have become the preferred materials for optoelectronic devices such as laser devices and light-emitting diodes.

However, to the present GaN-based semiconductor material device, due to a lack of GaN substrate, the epitaxial films of the GaN-based LED are mainly grown on the substrates such as sapphire substrates, SiC, Si substrate and so on. So far, epitaxial-growth technologies of GaN material series are basically based on highly mismatched hetero-epitaxy technologies. A hetero-epitaxial growth technology of sapphire substrate is the most widely used and protected. The main problems are that: firstly, the large lattice mismatch and thermal stress between the epitaxially grown GaN and the sapphire substrate can produce high concentration of dislocations of about $10^9$ cm$^{-2}$, which seriously degrades the quality of GaN crystal, and reduces illumination efficiency and the lifespan of LED. Secondly, because sapphire is an insulator with an electrical resistivity greater than $10^{11}$ Ωcm at room temperature, it is not suitable to be used for forming devices having vertical structures. Sapphire is usually only used to prepare N-type and P-type electrodes on the surface of the epitaxial layer, reducing effective lighting area, increasing the lithography and etching processes during the fabrication of the devices, and reducing the material utilization. Thirdly, sapphire has a poor thermal conductivity of about 0.25 W/cm K at 1000° C., which significantly affects performances of GaN-based devices, especially the large-area and high-power devices in which heat dissipation is required. Fourthly, sapphire has a high hardness and its lattice has a 30 degree angle relative to the lattice of GaN crystal, it is difficult to obtain a cleavage plane of the InGaN epitaxial layer to obtain a cavity surface during the fabrication of GaN-based Laser Diode (LD).

However, to the SiC substrate, it has lattice parameters closest to those of GaN and smaller lattice mismatch, but it also is hetero-epitaxy, and comprises misfit dislocations and thermal misfit dislocations. Moreover, SiC is expensive, making it unsuitable for many GaN-based optoelectronic devices (LED). In recently years, Si has also been studied as a substrate for the epitaxial growth of GaN. However, Si has a lattice mismatch to GaN even larger than sapphire/GaN, and Si has cubic crystalline lattice while GaN has a hexagonal crystalline lattice, which makes it difficult to support epitaxial growth of GaN material. The GaN layer grown on Si substrates faces serious problems such as cracking; the growth thickness usually cannot exceed 4 μm.

Therefore, to crystalline epitaxy, either the theory of epitaxial growth, or the development history of the semiconductor epitaxy technology, has proved that, homoepitaxy is an optimal selection. Recently, preparation technology of GaN mono-crystalline substrate has been developed, the appearance of GaN mono-crystalline substrate, makes GaN epitaxy return to homoepitaxy, and improves the quality of epitaxially grown GaN crystal. Moreover, the good thermal conductivity of the GaN crystals allows the GaN epitaxy substrate to be used in the formation of vertical structures for LED devices. The properties of the devices are improved under large current injections. However, the high cost of the GaN mono-crystalline substrate severely restricts its usage in LED devices. While a 2 inch wide high power LED epitaxial substrate is typically less than 100 dollars, the price for a 2 inch wide GaN mono-crystalline substrate currently can reach 2000 dollars.

SUMMARY OF THE INVENTION

The present invention aims to provide new types of efficient composite substrates directly usable for GaN epitaxial growth, which provides homoepitaxy required by GaN epitaxy with improved crystalline quality, allows formation of a vertical structure LED. Moreover, the disclosed method reduces production cost, and avoids the problem of pollution of experimental instruments caused by the diffusion and volatilization of a metal material during the growth by MOCVD at high temperature.

The disclosed composite substrate for GaN growth includes a thermally and electrically conductive layer and a GaN mono-crystalline layer on the thermally and electrically conductive layer, wherein at least a side wall of the composite substrate is cladded with a protective layer for preventing metal from diffusing.

The disclosed composite substrate includes a main body of the substrate composed of at least two layers of materials and a protective layer for preventing metal from diffusing which clads the main body partially (the surface of the GaN mono-crystalline layer used for GaN growth is required to be exposed). As shown in FIG. 1, the composite substrate firstly includes a thermally and electrically conductive layer 2, a GaN mono-crystalline layer 1 bonded on the thermally and electrically conductive layer, and then partially cladded with an outer protective layer 3 for preventing metal from diffusing.

The thermally and electrically conductive layer has a thickness in range of 10~3000 μm, preferably 50~400 μm. Materials suitable for the thermally and electrically conductive layer are required to have several characteristics: (1) a melting point greater than 1000° C., or nearly in solid state under 1000° C.; and (2) high thermal and high electrical conductivities.

Based on the above requirements, materials suitable for the thermally and electrically conductive layer can be selected from metal elements or alloys or quasi-alloys, such as W, Ni, Mo, Pd, Au, Cr, and so on, or alloys of any two or more kinds of the above metals, or alloys of one or more above metals with Cu, such as WCu alloy, MoCu alloy and NiCu alloy and so on. Materials suitable for the thermally and electrically conductive layer can also be Si crystalline, SiC crystalline, or AlSi crystalline and so on.

The GaN mono-crystalline layer on the thermally and electrically conductive layer has a thickness in a range of 0.1~100 μm, preferably 1~20 μm. The GaN mono-crystalline layer is in the form of a mono crystal.

The thermally and electrically conductive materials can be bonded with the GaN mono-crystalline through rigid bonding or flexible bonding. If the bonding is a rigid van der Waals force bonding, the thermal expansion coefficient of the thermally and electrically conductive layer should be close to the thermal expansion coefficient of the GaN mono-crystalline layer, wherein the term "close" here means that the difference of the coefficient of thermal expansion is within 10%, and there's no medium between the thermally and electrically conductive materials and the GaN mono-crystalline. And the thermally and electrically conductive layer can also be bonded with GaN mono-crystalline layer through a flexible medium. If bonded through a flexible medium, the medium is required to have a melting point greater than 1000° C., and certain ductility, to relax stress, preferably Au—Au bonds with a thickness ranged 0.5~5 µm, or bonds between W, Pd, or Ni and other high-temperature metals. The metal medium bonding layer with the thickness, can relax the thermal mismatch stress produced by different coefficient of thermal expansions between the GaN mono-crystalline layer and the thermally and electrically conductive layer, therefore, while bonded with the flexible medium, the thermal expansion coefficient of the thermally and electrically conductive layer is not required to be close to that of GaN.

The composite substrate of the present invention is designed to be partially cladded with an outer protective layer for preventing metal from diffusing. The material selection for the protective layer has the following requirements: first, the materials should not be disassembled and melted under the temperature of 1100° C.; second, the materials should not use metals and should have no volatility, preferably can be $SiO_2$, $Si_3N_4$, SiC, GaN, or AlN and so on. The protective layer has a thickness in range of 20 nm~5 µm, preferably 100 nm~2 µm. The protective layer is designed to use incomplete cladding methods, and the cladding methods mainly include the following six types:

The first type, the protective layer 3 clads only on the side walls of the composite substrate, as shown in FIG. 2;

The second type, the protective layer 3 clads not only on the side walls but also on the 1-10 mm wide region of the surface edge of the GaN mono-crystalline layer 1 of the composite substrate, preferably on the 1-5 mm wide region of the surface edge of the GaN mono-crystalline layer 1, as shown in FIG. 3;

The third type, the protective layer 3 clads not only on the side walls but also on the 1-10 mm wide region of the bottom surface edge of the thermally and electrically conductive layer 2 of the composite substrate, preferably on the 1-5 mm wide region of the bottom surface edge of the thermally and electrically conductive layer 2, as shown in FIG. 4;

The fourth type, the protective layer 3 clads not only on the side walls but also on both the 1-10 mm wide region of the surface edge of the GaN mono-crystalline layer 1 and the 1-10 mm wide region of the bottom surface edge of the thermally and electrically conductive layer 2 of the composite substrate, preferably on the 1-5 mm wide regions of the surface edge of the GaN mono-crystalline layer 1 and the bottom surface edge of the thermally and electrically conductive layer 2, as shown in FIG. 5;

The fifth type, the protective layer 3 clads not only on the side walls but also on the whole bottom surface of the thermally and electrically conductive layer 2 of the composite substrate, as shown in FIG. 1;

The sixth type, the protective layer 3 clads not only on the side walls but also on the whole bottom surface of the thermally and electrically conductive layer 2 and the 1-10 mm wide region of the surface edge of the GaN mono-crystalline layer of the composite substrate, wherein the width of the region preferably is 1-5 mm, as shown in FIG. 6.

The design of the protective layer for preventing metal from diffusing is very important. The main body of the composite substrate of the present invention is a multilayer structure, at least includes a bilayer structure of the GaN mono-crystalline layer and the thermally and electrically conductive layer bonded with a bonding layer. As mentioned above, materials used for the thermally and electrically conductive layer preferably are metallic materials, including W, Ni, Mo, Pd, Au, Cr, and so on, or alloys of them. Similarly, materials used for the bonding layer are mostly Au—Au bonds, or bonds between W, Pd or Ni and other high-temperature metals. Among the metallic materials, some metallic materials, particularly gold is an element having strong diffusibility at high temperature. The GaN epitaxy needs to be grown in high-precision Metal-organic Chemical Vapor Deposition (MOCVD) equipment. However, the diffusion of the metals will cause the reaction chambers of the equipment to be contaminated, and thus damage the equipment, which brings great difficulty to the usage of the composite substrate. Therefore, the design of the outer protective layer for preventing metal from diffusing at high temperature is very important.

Choosing a protective layer having some thickness can help the composite substrate prevent metal from diffusing at high temperature effectively. The previous four protective design projects are mainly used for preventing the problems caused by the weak diffusibility of the metallic materials for the thermally and electrically conductive layer, and the serious diffusibility of the metallic materials for the bonding layer. The fifth and sixth projects are mainly used for preventing the problems caused by the serious diffusibility of metallic materials for the thermally and electrically conductive layer and the metallic materials for the bonding layer. However the designs for the partial protection of the GaN surface in the second, the forth and the sixth types of protective layers are mainly used for preventing the problems of the breakdown of the GaN edge during the growth process.

Furthermore, the composite substrate has a reflective layer, which is located inside, in the lower portion, or on the bottom surface of the GaN mono-crystalline layer, the bottom surface of the GaN mono-crystalline layer is the interface of the GaN mono-crystalline layer connected with the thermally and electrically conductive layer. The reflective layer can be located at the bonding layer between the thermally and electrically conductive layer and the GaN mono-crystalline layer, and the reflective layer is adjacent to the GaN mono-crystalline layer (that is, between the bonding layer and the GaN mono-crystalline layer), as shown in FIG. 7; and can also be located inside the GaN mono-crystalline layer, as shown in FIG. 8. If the reflective layer is sandwiched at the bonding layer that is close to the GaN mono-crystalline layer, the reflective layer can be a metallic reflective layer, such as Pd, Cr and so on. If the reflective layer is located inside or in the lower portion of the GaN mono-crystalline layer, the reflective layer can be in a periodic or quasi-periodic structure, with grating structures or photonic lattice structures, as shown in FIG. 9.

The grating structures are micron-scale periodic structures. The photonic lattice structures are nano-scale periodic structures which can be periodic protrusions or recesses. The protrusions and the recesses can have conical shapes, truncated cone shapes, cylindrical shapes, triangular pyramidal shapes, or other shapes. As shown in FIGS. 10A and 10B, wherein FIG. 10A shows triangular pyramidal recesses distributed periodically, FIG. 10B shows cylindrical recesses distributed periodically. These micron-scale or nano-scale periodic structures could be 10 nm~50 µm, preferably 200 nm~10 µm. In FIGS. 10A and 10B, w and d respectively represent the largest width and depth of the recesses, A represents period of structure, wherein A>w.

The micron-scale or nano-scale periodic structures in the reflective layers are usually made of heat-resistant (melting point greater than 1000° C.) materials with a refractive index different from that of the GaN, for example, forming periodic structures by materials such as $SiO_2$, SiN that can grow in a crystalline phase, or coated on or embedded in the GaN mono-crystalline layer. These materials have refractive index different from that of GaN, and generate effective total internal reflections, and the average refractive index at the interface is efficiently increased by the periodic structures.

In some instances, the periodic structures located at the lower portion of the GaN mono-crystalline layer are not made of materials different from GaN, but are just periodic patterns formed at the lower portion of the GaN mono-crystalline layer, such periodic patterns can also act as reflective layers.

The reflective layer plays a very important role on the GaN-based devices epitaxially grown on the composite substrate of the present invention. Usually, in the light emitting devices epitaxially grown on the substrates, the light from active layer can be emitted in a 360 degree angular range, as shown in FIG. 11. If there's no design of reflective layer, 40% of the light emitted to the thermally and electrically conductive layer direction from luminescent materials will be absorbed by the substrates and won't be emitted, therefore, the incorporation of the reflective layers to the disclosed composite substrate can thus increase light emission efficiency more than 30%.

The composite substrate of the present invention can be directly used for the epitaxial-growth of GaN epitaxial layer, and thus the preparation of a vertical structure LED device. The disclosed composite substrate has the one or more following additional advantages compared with conventional technologies.

Firstly, compared with the growth of sapphire substrate in the prior art. Nowadays, sapphire substrate is a substrate that is the most commonly used for growth of GaN epitaxial layer, because the sapphire substrate has non electro-conductivity and non-thermal-conductivity, it is difficult or impossible to grow a vertical structure LED device by the GaN grown on the sapphire substrate, and the planar structure LEDs grown on sapphire substrates the most commonly do not dissipate heat well and are not suitable for high power devices. Additionally, sapphire substrate has a different lattice from that of GaN, which limits the quality of GaN crystals, making it unable to prepare high quality GaN epitaxial layers.

Compared with the sapphire substrate, the composite substrate of the present invention has very obvious advantages. On one hand, the composite substrate has a GaN mono-crystalline layer that enables homoepitaxial growth of GaN epitaxial layers on the composite substrate, with improved crystalline quality of growing GaN epitaxial layers, and thus increased quantum efficiency. On the other hand, there is a thermally and electrically conductive layer in the composite substrate, which allows a vertical structure LED device to be directly prepared by GaN epitaxial layers grown on the composite substrate according to traditional chip technology, without the limit of the non-electro-conductivity and non-thermal-conductivity of the substrate, which greatly increases device efficiency.

Secondly, compared to the growth of Si substrate and SiC substrate in the prior art. Although a vertical structure LED may be directly prepared by GaN epitaxial layers grown on this two kinds of substrates, because of their electro-conductivity and thermal-conductivity, both of them are hetero-epitaxy, which are not good for improving the crystalline quality of GaN. Especially for the Si substrate, AlGaN layers need to be inserted between epitaxy grown GaN crystal on it to relax stress, and the GaN crystal can hardly grow thicker than 3-4 μm on Silicon substrate. Although the lattice constant of a SiC substrate is close to that of a GaN crystal, it is difficult to prepare SiC crystals, and costs are high, which makes it's difficult to be widely applied in GaN-based high power LED devices. Compared with the two kinds of substrates, the main advantages of the composite substrate of the present invention are that, the composite substrate enables homoepitaxial growth, which can greatly improve the crystalline quality of GaN epitaxial layers, and makes it suitable for a wide range of applications.

Thirdly, compared with GaN mono-crystalline substrate, GaN mono-crystalline substrate which is homoepitaxial substrate and the composite substrate of the present invention provide homoepitaxy growth, and the crystalline quality are greatly improved by employing the epitaxial growth of the two kinds of substrates. However, compared with the high cost of the GaN mono-crystalline substrate, the composite substrate of the present invention employs thermally and electrically conductive materials of raw materials cost lower, and GaN mono-crystalline layer whose thickness is only one in four hundred to one quarter of the GaN mono-crystalline substrates, the price of which is far lower than GaN mono-crystalline substrates, so there is a more wider application aspect.

Lastly, the use of the protective layer effectively avoids the problem of pollution of experimental instruments caused by the diffusion and volatilization of the thermally and electrically conductive layer, the bonding layer and/or the reflective layer made of metal materials during the growth of MOCVD at high temperature.

These and other aspects, their implementations and other features are described in detail in the drawings, the description and the claims.

BRIEF DESCRIPTION OF THE DRAWINGS

FIG. 8 is a schematic diagram of the composite substrate in which a reflective layer is located inside the GaN mono-crystalline layer in the composite substrate.

FIG. 9 is a schematic diagram of a periodic grating or a periodic photonic lattice structure suitable for the reflective layer.

FIGS. 10A-10B area schematic diagram of the reflective layer having triangular pyramidal recess (FIG. 10A) or cylindrical recess (FIG. 10B) shaped periodic structures.

FIG. 11 is a schematic drawing illustrating the light-emitting solid beam angle and the superficial beam light cone of the LED active layer.

FIGS. 12A-12D show the process for preparing GaN/WCu composite substrate having a reflective layer in the GaN mono-crystalline layer and a protective layer on the side walls as described in Embodiment 1, wherein FIG. 12A is a schematic diagram showing the preparation of $SiO_2$ cylindrical periodic structures on the GaN surface of 4 μm GaN/sapphire substrate in the second step; FIG. 12B is a schematic diagram showing growing GaN continuously by HVPE technology until the thickness of GaN reaches to 10 μm after the reflective layer is prepared in the third step; FIG. 12C is a schematic diagram showing the GaN mono-crystalline layer with a reflective layer located on the Si substrate obtained after manufacture in the fourth step; FIG. 12D is a schematic diagram showing GaN/WCu composite substrate obtained finally.

FIGS. 16A-16B show the process for preparing GaN/MoCu composite substrate in which there's a metal reflective layer as described in Embodiment 3, wherein FIG. 16A is a schematic diagram showing the structure obtained by depositing a Pd metal reflective layer on the GaN mono-crystalline layer bonded on the Si substrate in the third step; FIG. 16B is a schematic diagram showing obtaining GaN/MoCu composite substrate which has a Pd metal reflective layer and is cladded with a protective layer by Ni—Ni bonds.

FIGS. 17A-17D show the process for preparing composite substrate in which the GaN mono-crystalline layer is bonded with Si substrate by a van der Waals force as described in Embodiment 4, wherein FIG. 17A is a schematic diagram showing the preparation of $SiO_2$ cylindrical periodic structures on the GaN surface of GaN/sapphire substrate in the third step; FIG. 17B is a schematic diagram showing growing GaN continuously by HVPE technology until the thickness of GaN reaches to 50 μm after the reflective layer is prepared in the fourth step; FIG. 17C is a schematic diagram showing the formation of sapphire substrate/GaN/Si structure by a van der Waals force in the fifth step; FIG. 17D is a schematic diagram showing the GaN/Si composite substrate obtained by laser lift-off in the sixth step.

In the figures: 1—a GaN mono-crystalline layer, 2—a thermally and electrically conductive layer, 3—a protective layer, 4—a bonding layer, 5 a reflective layer, 5'—patterned structures in a reflective layer, 6—a sapphire substrate, 7—a Si substrate, 8—a SiC mono-crystalline substrate, 9—a AlSi mono-crystalline substrate.

DETAILED DESCRIPTION OF THE INVENTION

Next, with reference to the drawings, the present invention will be illustrated in detail through the embodiments, but this is not to limit the invention, those skilled in the art could make various amendments or improvements according to the basic thought of the invention, it belongs to the scope of the present invention overall, if not depart from the basic thought of the invention.

Embodiment 1: A Metal Composite Substrate Comprising a WCu Metal Substrate and a GaN Mono-Crystalline Layer Bonded with Au—Au Bonds In the first step, a 4 μm thick GaN mono crystal epitaxial layer 1 is grown on a 2 inch 430 μm thick sapphire substrate 6 using Metal-organic Chemical Vapor Deposition (MOCVD) well-known in the art.

In the second step, a 1 μm layer of $SiO_2$ thin film is grown on the surface of the GaN mono-crystalline that has been grown using plasma enhanced chemical vapor deposition (PECVD) technology, the $SiO_2$ thin layer is then patterned with lithography and dry etched well-known in the art into periodic conical structures 5' spaced by a period of about 3 μm, with a base diameter of about 2.5 μm and a height of about 1 μm, as shown in FIG. 12A. The GaN surface is exposed in the space between the conical patterns. The periodic structures can be used as a reflective layer.

Figure 1:
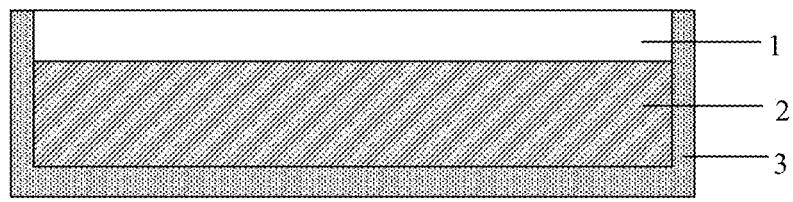
FIG. 1 is a schematic diagram of a composite substrate in accordance with the present invention.
Figure 2:
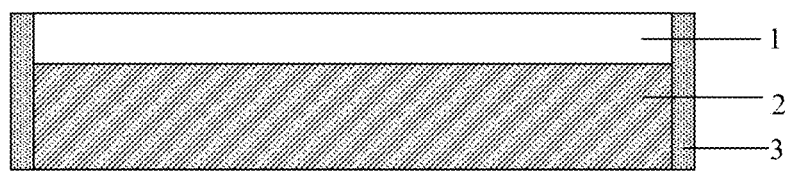
FIG. 2 is a schematic diagram of the composite substrate in which side walls of the composite substrate are cladded with a protective layer for preventing metal from diffusing.
Figure 3:
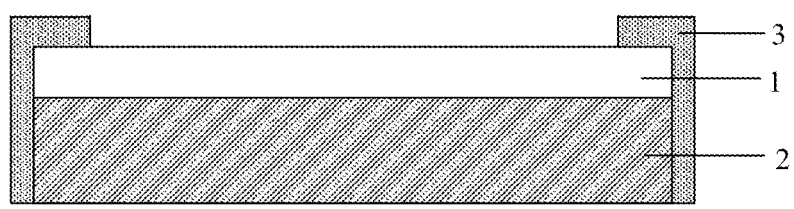
FIG. 3 is a schematic diagram of the composite substrate in which the side walls and a portion of the top surface of the composite substrate are cladded with protective layers for preventing metal from diffusing.
Figure 4:
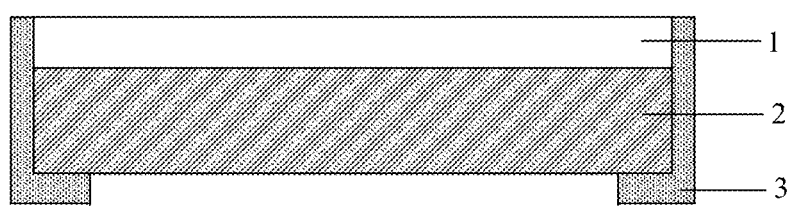
FIG. 4 is a schematic diagram of the composite substrate in which the side walls and a portion of the bottom surface of the composite substrate are cladded with protective layers for preventing metal from diffusing.
Figure 5:
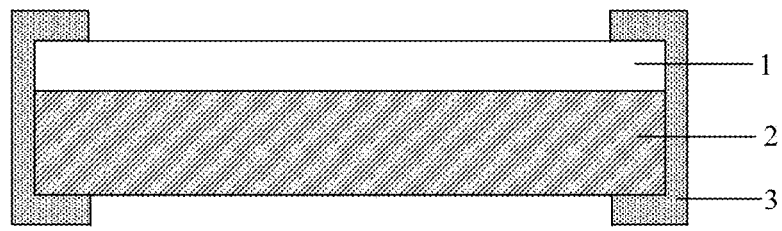
FIG. 5 is a schematic diagram of the composite substrate in which the side walls, a portion of the top surface and a portion of the bottom surface of the composite substrate are cladded with protective layers for preventing metal from diffusing.
Figure 6:
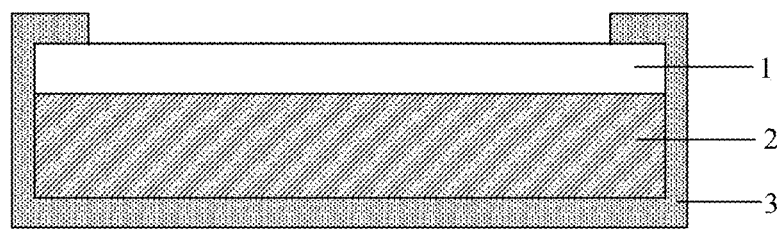
FIG. 6 is a schematic diagram of the composite substrate in which the side wall, a portion of the surface and the whole bottom surface of the composite substrate are cladded with protective layers for preventing metal from diffusing.
Figure 7:
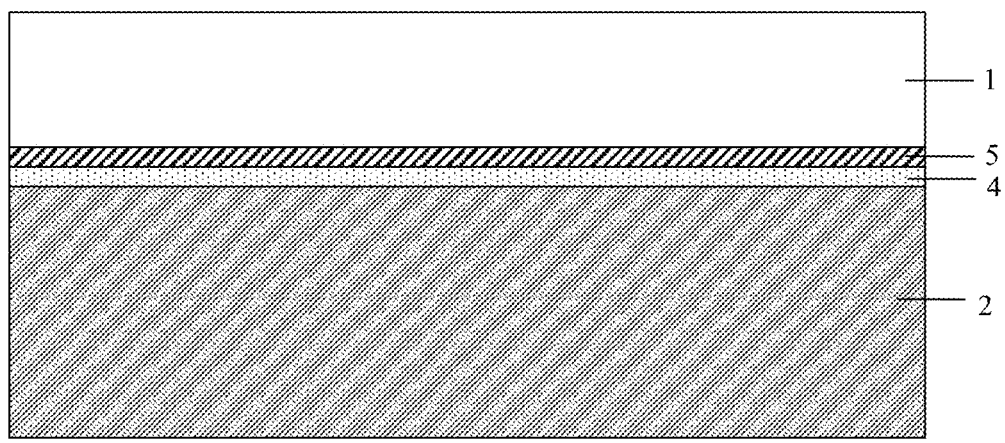
FIG. 7 is a schematic diagram of the composite substrate in which a reflective layer is located at the bonding layer of the composite substrate and is adjacent to the GaN mono-crystalline layer.
Figure 12:
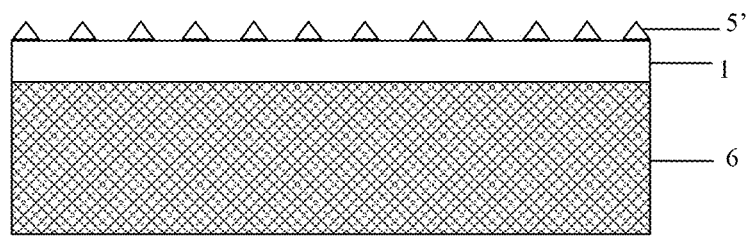
Figure 12B:
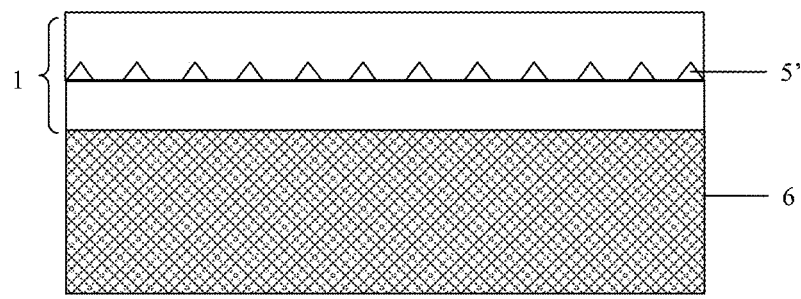

In the third step, GaN is continuously grown on the surface of the GaN mono-crystalline with a reflective layer prepared using HVPE technology well-known in the art, until the thickness of GaN mono-crystalline reaches to 10 μm, as shown in FIG. 12B.

Figure 12C:
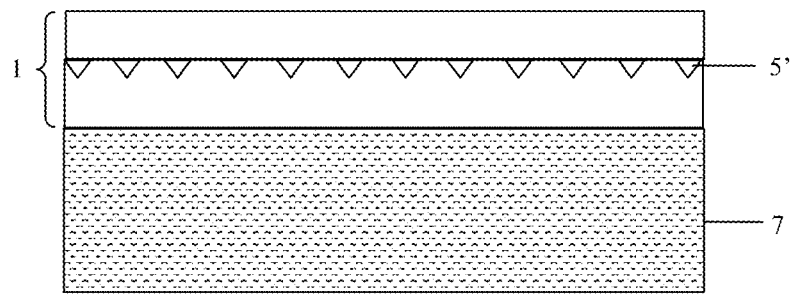
Figure 13:
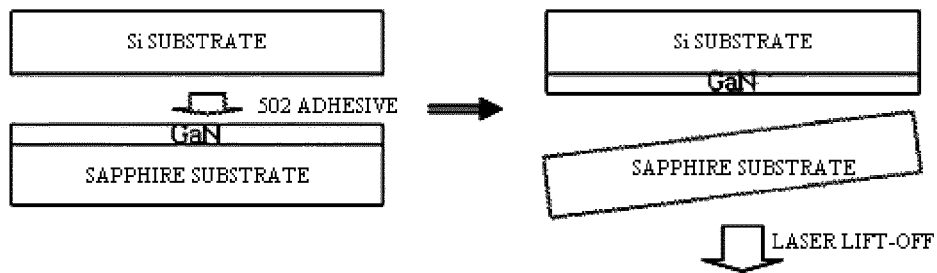
FIG. 13 is a schematic diagram showing the steps of bonding the Si substrate with 502 adhesive and lifting off the sapphire substrate by laser in the fourth step as described in Embodiment 1.

In the fourth step, the GaN surface of the GaN mono-crystalline that has been grown is bonded with a 2 inch 400 μm thick mono-crystalline Si substrate 7 by 502 instant adhesive, using a Si substrate 7 as a transfer and support substrate, and the sapphire substrate is then lifted off by laser lift-off technology well-known in the art, leaving GaN mono-crystalline bonded on the Si substrate, the process of transferring and lifting off is as shown in FIG. 13, the GaN mono-crystalline layer with a reflective layer located on the Si substrate obtained is as shown in FIG. 12C.

Figure 14:
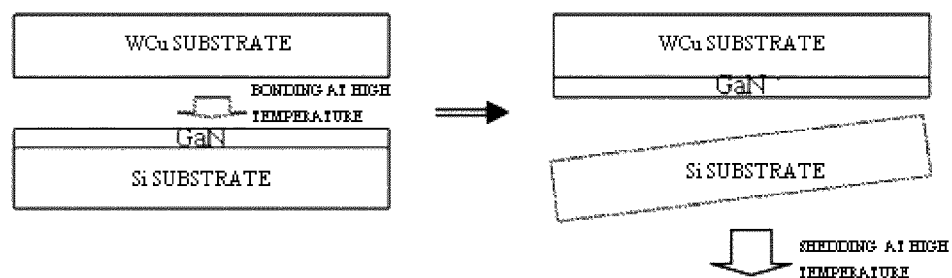
FIG. 14 is a schematic diagram showing the steps of bonding at high temperature and shedding Si substrate at high temperature in the fifth step as described in Embodiment 1.

In the fifth step, a 1 μm Au layer is deposited simultaneously on the GaN surface of GaN mono-crystalline on the Si substrate and the surface of WCu alloy substrate, and then they are bonded together at 300° C., under a pressure of 5 tons, for 15 minutes. After bonding, the 502 instant adhesive is carbonized at high temperature, which allows Si substrate to separate from GaN/WCu composite substrate automatically, as shown in FIG. 14.

In the sixth step, a 500 nm $SiO_2$ thin film protective layer is grown on the face, inverse and side of the substrate, then the side walls of the substrate are protected by photoresist, the $SiO_2$ thin films on the GaN surface and bottom surface of the substrate are etched off using BOE solutions, leaving the protective region of the side wall.

Figure 12D:
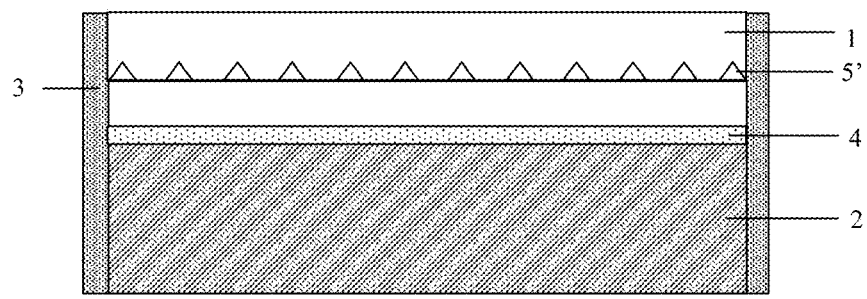

At last, a composite substrate as shown in FIG. 12D is obtained after surface cleaning, which includes a 150 μm thick WCu alloy metal substrate 2 with a W:Cu mass ratio of 15:85. The WCu alloy metal substrate and a layer of 10 μm thick GaN mono-crystalline are bonded with Au—Au bonds by a Au bonding layer 4 2 μm in thickness. The substrate has a 500 nm thick $SiO_2$ protective layer 3 on the side wall, which is designed as the first type of the design project described in the summary of the invention. A reflective layer of patterned structures 5' of is embedded in the GaN mono-crystalline layer 1 and is at 4 μm distance from the bonding layer 4. The patterned structures are conical $SiO_2$ patterned layer structures spaced at a 3 μm period, with a height of about 1 μm and a bottom diameter about 2.5 μm, as shown in FIG. 12.

Embodiment 2: A Metal Composite Substrate Comprising a MoCu Metal Substrate and a GaN Mono-Crystalline Layer Bonded with Au—Au Bonds In the first step, a 4 μm thick GaN mono-crystalline epitaxial layer is grown on a 2 inch 430 μm thick sapphire substrate using MOCVD technology well-known in the art.

In the second step, a layer of 1 μm thick $SiO_2$ thin film is grown on the surface of the GaN mono-crystalline that has been grown using PECVD technology, and the $SiO_2$ thin layer is then patterned with lithography and dry etched well-known in the art into periodic conical structures spaced by a period of 3 μm, with a base diameter of 2.5 μm, a height of 1 μm, as shown in FIG. 12A. The GaN surface is exposed in the space between the conical patterns. The periodic structures can be used as a reflective layer.

In the third step, GaN is continuously grown on the surface of the GaN mono-crystalline with a reflective layer prepared using HVPE technology well-known in the art, until the thickness of GaN mono-crystalline reaches to 10 μm, as shown in FIG. 12B.

In the fourth step, the GaN surface of the GaN mono-crystalline that has been grown and a 2 inch 400 μm thick Si mono-crystalline substrate are bonded with 502 instant adhesive, using the Si substrate as a transfer and support substrate. And the sapphire substrate is then lifted off by laser lift-off technology well-known in the art, leaving GaN mono-crystalline bonded on the Si substrate. The process is as shown in FIG. 13, and the product prepared is as shown in FIG. 12C.

In the fifth step, a 1 μm Au layer is deposited simultaneously on the GaN surface of GaN mono-crystalline on the Si substrate and the surface of MoCu alloy substrate, and then they are bonded together at 300° C., under a pressure of 5 tons, for 15 minutes. After bonding, the 502 instant adhesive is carbonized at high temperature, which allows Si substrate to separate from GaN/WCu composite substrate automatically.

In the sixth step, a 2 μm thick $Si_3N_4$ thin film protective layer is grown on the face, inverse and side of the substrate, then the side walls of the substrate and the 5 mm area of the GaN surface edge are protected by photoresist, the $Si_3N_4$ thin films on the rest portion of the GaN surface and the entire bottom surface of the substrate are etched off using BOE solutions, leaving the side walls and the 5 mm region of the GaN surface edge.

Figure 15:
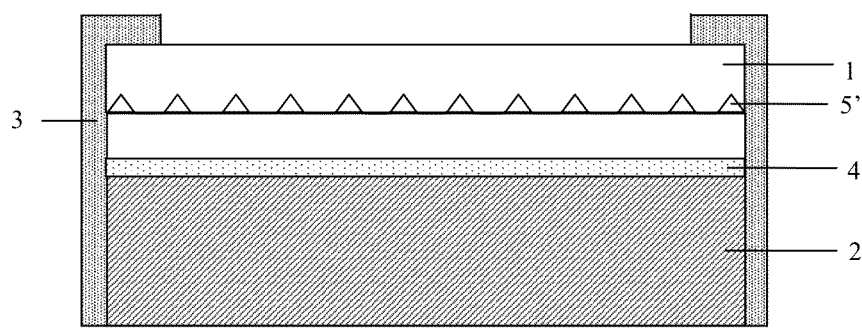
FIG. 15 is a schematic diagram of GaN/MoCu composite substrate prepared in Embodiment 2.

At last, a composite substrate as shown in FIG. 15 is obtained after surface cleaning, which includes a layer of 150 μm thick MoCu alloy metal substrate 2 with a Mo:Cu mass ratio of 20:80. The MoCu alloy metal substrate and a layer of 10 μm thick GaN mono-crystalline 1 are bonded with Au—Au bonds, wherein the bonding layer 4 of Au is 2 μm in thickness. The substrate has a 2 μm thick $Si_3N_4$ protective layer 3 on the side walls and a portion of the top surface, which is designed as the second type of the design project described in the summary of the invention. A reflective layer of patterned structures 5' is embedded in the GaN mono-crystalline layer 1 and is at 4 μm distance from the bonding layer 4. The patterned structures are conical $SiO_2$ patterned layer structures spaced at a 3 μm period, with a height of about 1 μm and a base diameter about 2.5 μm.

Embodiment 3: A Metal Composite Substrate Comprising a MoCu Metal Substrate and a GaN Mono-Crystalline Layer Bonded with Ni—Ni Bonds In the first step, a 4 μm thick GaN mono-crystalline epitaxial layer is grown on a 2 inch 430 μm thick sapphire substrate using MOCVD technology well-known in the art.

In the second step, the GaN surface of the GaN mono-crystalline that has been grown and a 2 inch 400 μm thick Si mono-crystalline substrate are bonded with 502 instant adhesive, using the Si substrate as a transfer and support substrate, and the sapphire substrate is then lifted off by laser lift-off technology well-known in the art, leaving GaN mono-crystalline bonded on the Si substrate, as shown in FIG. 13.

Figure 16A:
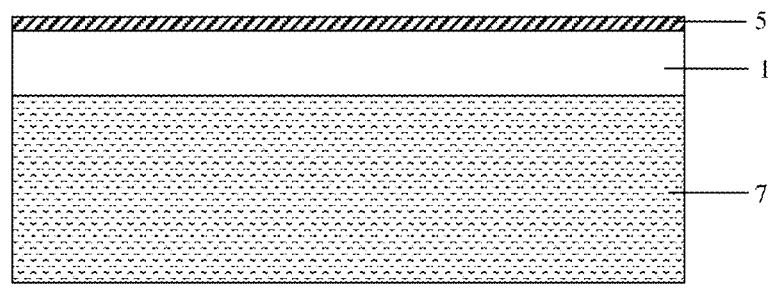

In the third step, a reflective layer 5 is formed by depositing a 200 nm Pd metal layer on the GaN surface of the GaN mono-crystalline layer on the Si substrate, as shown in FIG. 16A.

In the fourth step, a 2 μm Ni is deposited simultaneously on the reflective layer of GaN mono-crystalline on the Si substrate that has deposited the reflective layer and the surface of MoCu alloy substrate, and then they are bonded together at 800° C., under a pressure of 15 tons, for 15 minutes, the bonding techniques is referred to FIG. 14. After bonding, the 502 instant adhesive is carbonized at high temperature, which allows Si substrate to separate from GaN/MoCu composite substrate automatically.

In the fifth step, a 50 μm thick $Si_3N_4$ thin film protective layer is grown on the face, inverse and side of the substrate, then the side walls of the substrate and the 5 mm area of the bottom surface edge of the MoCu substrate are protected by photoresist, the $Si_3N_4$ thin films on the rest portion of the GaN surface and the whole bottom surface of the substrate are etched off using BOE solutions, leaving the side walls and the 5 mm region of the bottom surface edge of the MoCu substrate.

Figure 16B:
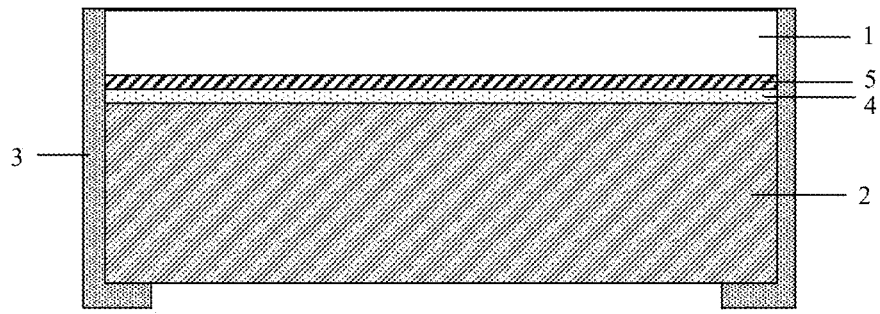

At last, a composite substrate as shown in FIG. 16B is obtained after surface cleaning, which includes a layer of 150 μm thick MoCu alloy metal substrate 2 with a Mo:Cu mass ratio of 20:80. The MoCu alloy metal substrate and a layer of 4 μm thick GaN mono-crystalline 1 are bonded with Ni—Ni bonds, wherein the bonding layer 4 of Ni is 4 μm in thickness. The substrate has a 50 nm thick $Si_3N_4$ protective layer 3 on the side walls and a portion of the bottom surface, which is designed as the third type of the design project described in the summary of the invention. A layer of Pd metal reflective layer 5 is embedded in the GaN mono-crystalline layer 1 close to the bonding layer 4.

Embodiment 4: A Composite Substrate Comprising a Si Substrate and a GaN Mono-Crystalline Layer Bonded by Van der Waals Force In the first step, a 4 μm thick GaN mono-crystalline epitaxial layer is grown on a 2 inch 430 μm thick sapphire substrate using MOCVD technology well-known in the art.

In the second step, GaN is continuously grown on the GaN mono-crystalline using HVPE technology well-known in the art, until the thickness of GaN mono-crystalline reaches to 46 μm.

Figure 17A:
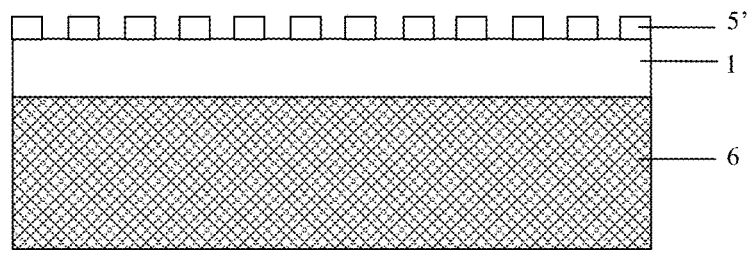

In the third step, a layer of 1 μm thick $SiO_2$ thin film is grown on the surface of the GaN mono-crystalline that has been grown by PECVD technology, and the $SiO_2$ thin layer is then patterned with lithography and dry etched well-known in the art into periodic cylindrical patterned structures 5' spaced by a period of about 3 μm, with a base diameter of about 2 μm and a height about 1 μm, as shown in FIG. 17A. The GaN surface is exposed in the space between the cylindrical structures. The periodic structures can be used as a reflective layer.

Figure 17B:
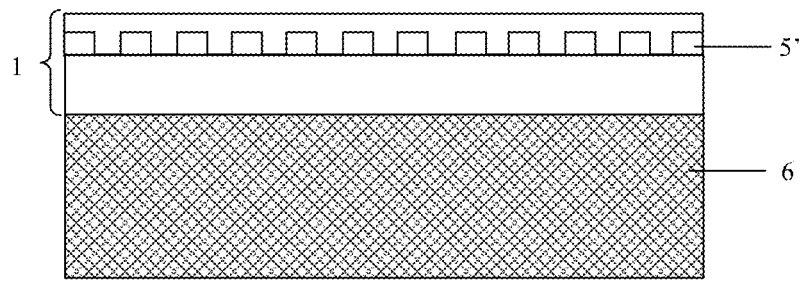
Figure 17C:
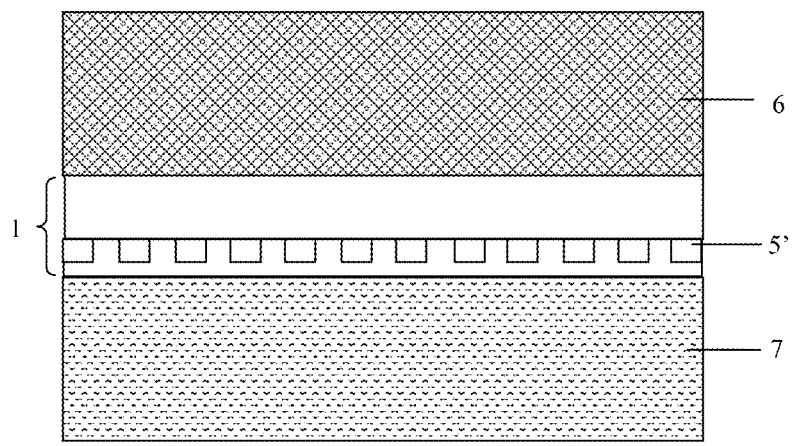
Figure 17D:
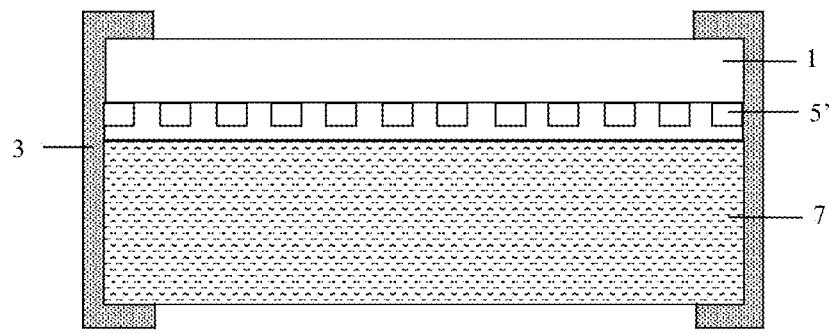

In the fourth step, GaN is continuously grown on the GaN mono-crystalline that has prepared a reflective layer using HVPE technology well-known in the art, until the thickness of GaN mono-crystalline reaches to 50 μm, as shown in FIG. 17B.

In the fifth step, the GaN mono-crystalline prepared with a reflective layer and a 400 μm thick Si layer are directly bonded by van der Waals force, at 900° C., under a pressure of 20 tons, for 30 minutes, forming a structure sample like sapphire/GaN/Si, as shown in 17C.

In the sixth step, the sapphire substrate is then lifted off by laser lift-off technology well-known in the art, leaving the composite substrate with GaN/Si bonded.

In the seventh step, a 5 μm thick $SiO_2$ thin film protective layer is grown on the face, inverse and side of the substrate, then the side walls and the 5 mm areas of the GaN surface edge and the bottom surface edge of Si substrate of the substrate are protected by photoresist, the $SiO_2$ thin films on the rest portions of the GaN surface and the bottom surface of Si substrate and the whole bottom surface of the substrate are etched off using BOE solutions, leaving the side walls and the 5 mm region of the GaN surface edge and the bottom surface edge of Si substrate.

At last, a composite substrate as shown in 17D is obtained after surface cleaning, which includes a layer of 400 μm thick mono-crystalline Si substrate 7, bonded with a layer of 50 μm thick GaN mono-crystalline 1 through a van der Waals force. The substrate has a 5 μm thick $SiO_2$ protective layer 3 on the side walls and a portion of the GaN surface and the bottom surface of Si substrate, which is designed as the forth type of the design project described in the summary of the invention. A reflective layer of patterned structures 5' is embedded in the GaN mono-crystalline layer 1 and is at a 4 μm distance from the bonding layer. The patterned structures are cylindrical $SiO_2$ structures spaced at a 3 μm period with a height of about 1 μm and a base diameter about 2 μm.

Embodiment 5: A Metal Composite Substrate Comprising a SiC Substrate and a GaN Mono-Crystalline Layer Bonded with Pd—Pd Bonds In the first step, a 4 μm thick GaN mono-crystalline epitaxial layer is grown on a 2 inch 430 μm thick sapphire substrate using MOCVD technology well-known in the art.

In the second step, a layer of 1 μm thick $SiO_2$ thin film is grown on the surface of the GaN mono-crystalline that has been grown using PECVD technology, and the $SiO_2$ thin layer is then patterned with lithography and dry etched well-known in the art into periodic conical structures spaced by a period of about 3 μm, with a bottom diameter of 2.5 μm, a height of 1 μm, as shown in FIG. 12A. The GaN surface is exposed in the space between the conical structures. The periodic structure can be used as a reflective layer.

In the third step, GaN is continuously grown on the above GaN mono-crystalline that has prepared a reflective layer by HVPE technology well-known in the art, until the thickness of GaN mono-crystalline reaches to 10 μm, as shown in FIG. 12B.

In the fourth step, the GaN surface of the above GaN mono-crystalline grown and a 2 inch 400 μm thick Si mono-crystalline substrate are bonded by 502 instant adhesive, using Si substrate as a transfer and support substrate. And the sapphire substrate is then lifted off by laser lift-off technology well-known in the art, leaving GaN mono-crystalline bonded on the Si substrate, as shown in FIG. 13.

In the fifth step, a 1 μm Pd layer is deposited simultaneously on the GaN surface of the GaN mono-crystalline on the Si substrate and the surface of 200 μm thick SiC substrate. And then they are bonded together at 800° C., under a pressure of 8 tons, for 15 minutes. After bonding, the 502 instant adhesive is carbonized at high temperature, which allows Si substrate to separate from GaN/SiC composite substrate automatically.

In the sixth step, a 500 nm thick $SiO_2$ thin film protective layer is grown on the face, inverse and side of the substrate, then the side walls and the whole bottom surface of the SiC substrate are protected by photoresist, the $SiO_2$ thin film on the GaN surface of the substrate is etched off using BOE solutions, leaving the side walls and the whole bottom surface of the SiC substrate.

Figure 18:
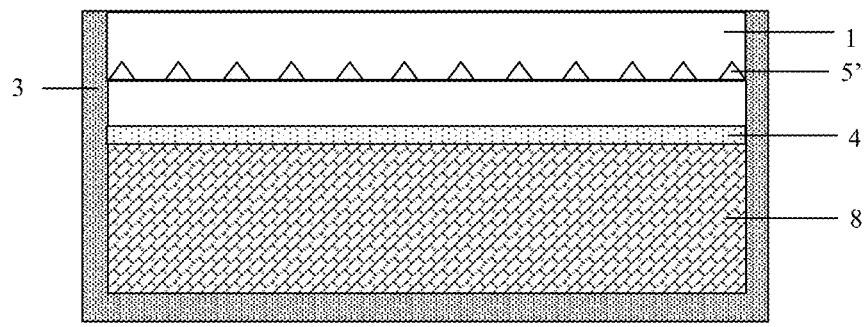
FIG. 18 is a schematic diagram of GaN/SiC composite substrate prepared in Embodiment 5.

At last, a composite substrate as shown in FIG. 18 is obtained after surface cleaning, which includes a layer of 200 μm thick SiC mono-crystalline substrate 8 which is bonded with a layer of 10 μm thick GaN mono-crystalline layer 1 by Pd—Pd bonds, wherein the bonding layer 4 of Pd is 2 μm in thickness. The substrate has a 500 nm thick $SiO_2$ protective layer 3 on the side walls and the whole bottom surface, which is designed as the fifth type of the design project described in the summary of the invention. A layer of patterned structures of reflective layer 5' is embedded in the GaN mono-crystalline layer 1 and is at a 4 μm distance from the bonding layer 4. The patterned structures are cylindrical $SiO_2$ patterned layer structures spaced at a 3 μm period with a height of about 1 μm and a base diameter about 2.5 μm.

Embodiment 6: A Composite Substrate Comprising a AlSi Substrate and a GaN Mono-Crystalline Layer Bonded with Au—Au Bonds In the first step, a 6 μm thick GaN mono-crystalline epitaxial layer is grown on a 2 inch 430 μm thick sapphire substrate using MOCVD technology well-known in the art.

In the third step, a layer of 1 μm thick $SiO_2$ thin film is grown on the surface of the above GaN mono-crystalline layer that has been grown by PECVD technology, and the $SiO_2$ thin layer is then patterned with lithography and dry etched well-known in the art into periodic conical structures spaced by a period of 3 μm, with a bottom diameter of 2 μm, a height of 1 μm, as shown in FIG. 17A. The GaN surface is exposed in the space between the conical structures. The periodic structure can be used as a reflective layer.

In the fourth step, GaN is continuously grown on the above GaN mono-crystalline layer that has prepared a reflective layer by HVPE technology well-known in the art, until the thickness of the GaN mono-crystalline layer reaches to 10 μm, as shown in FIG. 17B.

In the fifth step, a 1 μm Au layer is deposited simultaneously on the GaN surface of the sapphire substrate/GaN mono-crystalline layer and the surface of 200 μm thick AlSi substrate. And then they are bonded together at 300° C., under a pressure of 5 tons, for 15 minutes.

In the sixth step, the sapphire substrate is lifted off by laser lift-off technology well-known in the art, leaving a composite substrate structure with GaN/AlSi bonded.

In the seventh step, a 500 nm thick $SiO_2$ thin film protective layer is grown on the face, inverse and side of the substrate, then the side walls and the whole bottom surface of the AlSi substrate and the 2 mm area of the GaN surface edge are protected by photoresist, the $SiO_2$ thin film on a portion of the GaN surface of the substrate is etched off using BOE solutions, leaving the side walls and the whole bottom surface of the AlSi substrate and the 2 mm region of the GaN surface edge.

Figure 19:
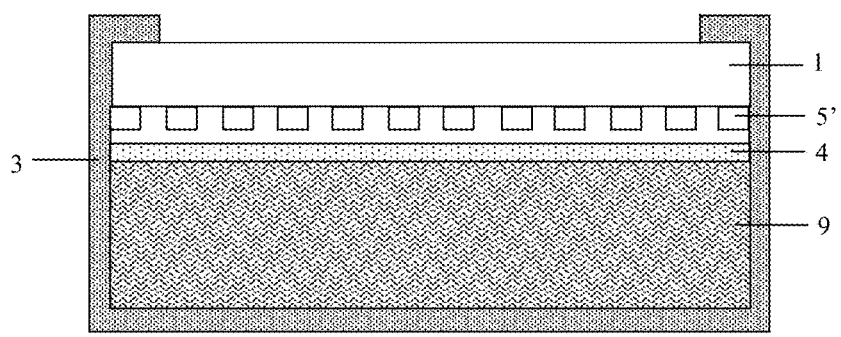
FIG. 19 is a schematic diagram of GaN/AlSi composite substrate prepared in Embodiment 6.

At last, a composite substrate as shown in FIG. 19 is obtained after surface cleaning, which includes a layer of 200 μm thick AlSi mono-crystalline substrate 9 with a Al:Si mass ratio of 30:70. The AlSi mono-crystalline substrate is bonded with a layer of 10 μm thick GaN mono-crystalline layer 1 by Au—Au bonds, wherein the bonding layer 4 of Au is 4 μm in thickness. The substrate has a 500 nm thick $SiO_2$ protective layer 3 on the side walls and the whole bottom surface and the 2 mm region of the GaN surface edge, which is designed as the sixth type of the design project described in the summary of the invention. A layer of patterned structures of reflective layer 5' is embedded in the GaN mono-crystalline layer and is at a 4 μm distance from the bonding layer 4, the patterned structures are cylindrical $SiO_2$ structures spaced at a 3 μm period, with a height of about 1 μm and a base diameter about 2 μm.

Embodiment 7: A Metal Composite Substrate Without Reflective Layer Comprising a WCu Metal Substrate and a GaN Mono-Crystalline Layer Bonded with Au—Au Bonds In the first step, a 4 μm thick GaN mono-crystalline epitaxial layer is grown on a 2 inch 430 μm thick sapphire substrate using MOCVD technology well-known in the art.

In the second step, GaN is grown continuously on the GaN mono-crystalline using technology well-known in the art, until the thickness of the GaN mono-crystalline reaches to 10 μm.

In the third step, the GaN surface of the GaN mono-crystalline that has been grown and a 2 inch 400 μm thick Si mono-crystalline substrate are bonded with 502 instant adhesive, using the Si substrate as a transfer and support substrate, and the sapphire substrate is then lifted off by laser lift-off technology well-known in the art, leaving GaN mono-crystalline bonded on the Si substrate.

In the fourth step, a 1 μm Au layer is deposited simultaneously on the GaN surface of GaN mono-crystalline on the Si substrate and the surface of WCu alloy substrate, and then they are bonded together at 300° C., under a pressure of 5 tons, for 15 minutes. After bonding, the 502 instant adhesive is carbonized at high temperature, which allows Si substrate to separate from GaN/WCu composite substrate automatically.

In the fifth step, a 500 nm thick $SiO_2$ thin film protective layer is grown on the face, inverse and side of the substrate, then the side walls and the whole bottom surface of the WCu substrate and the 2 mm area of the GaN surface edge are protected by photoresist, the $SiO_2$ thin film on a portion of the GaN surface of the substrate is etched off using BOE solutions, leaving the side walls and the whole bottom surface of the WCu substrate and the 2 mm region of the GaN surface edge.

Figure 20:
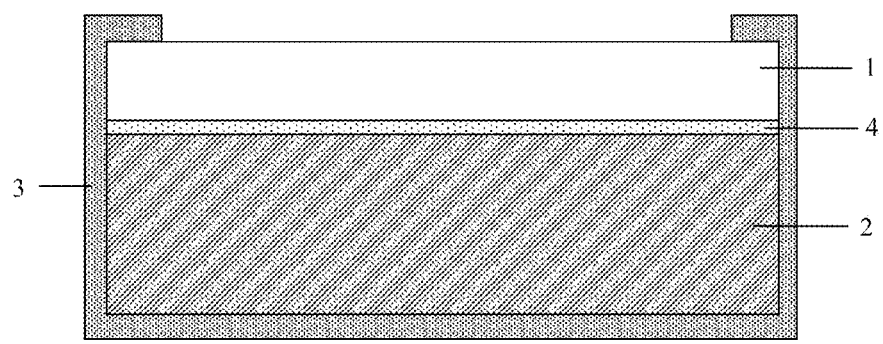
FIG. 20 is a schematic diagram of GaN/WCu composite substrate prepared in Embodiment 7.

At last, a composite substrate as shown in FIG. 20 is obtained after surface cleaning, which includes a 150 μm thick WCu alloy metal substrate 2 with a W:Cu mass ratio of 15:85. The WCu alloy metal substrate and a layer of 10 μm thick GaN mono-crystalline 1 are bonded with Au—Au bonds, wherein the bonding layer 4 of Au is 2 μm in thickness. The substrate has a 500 nm thick $SiO_2$ protective layer 3 on the side walls and the whole bottom surface and the 2 mm region of the GaN surface edge, which is designed as the sixth type of the design project described in the summary of the invention.

What is claimed is:

1. A composite substrate for GaN growth, comprising:
    a thermally and electrically conductive layer;
    a GaN mono-crystalline layer on the thermally and electrically conductive layer, wherein the thermally and electrically conductive layer has a melting point greater than 1000° C.; and
    a protective layer on at least one side wall of the composite substrate and configured to prevent metal from diffusing, wherein the protective layer comprises a material having a melting temperature above 1100° C.

2. The composite substrate of claim 1, wherein the material in the protective layer comprises $SiO_2$, $Si_3N_4$, SiC, GaN, or AlN.

3. The composite substrate of claim 1, wherein the protective layer clads at least one side wall of the composite substrate in one of the six types: 1) cladding only on the at least one side wall of the composite substrate; 2) cladding on the at least one side wall and a 1-10 mm wide region of the surface edge of the GaN mono-crystalline layer; 3) cladding on the at least one side wall and a 1-10 mm wide region of the bottom surface edge of the thermally and electrically conductive layer; 4) cladding on the at least one side wall, a 1-10 mm wide region of the surface edge of the GaN mono-crystalline layer, and a 1-10 mm wide region of the bottom surface edge of the thermally and electrically conductive layer; 5) cladding on the at least one side wall and a whole bottom surface of the thermally and electrically conductive layer; 6) cladding on the at least one side wall, a whole bottom surface of the thermally and electrically conductive layer and a 1-10 mm wide region of the surface edge of the GaN mono-crystalline layer.

4. The composite substrate of claim 1, wherein the protective layer has a thickness in range of 20 nm~5 μm, preferably 100 nm~2 μm.

5. The composite substrate of claim 1, wherein the thermally and electrically conductive layer has a thickness in range of 10~3000 μm, wherein the GaN mono-crystalline layer has a thickness in a range of 0.1~100 μm.

6. The composite substrate of claim 1, wherein the thermally and electrically conductive layer comprises alloys of one or more of W, Ni, Mo, Pd, Au or Cr, or alloys of one or more of W, Ni, Mo, Pd, Au, or Cr with Cu, Si crystalline, SiC crystalline, or AlSi crystalline.

7. The composite substrate of claim 1, further comprising:
    a flexible medium bonding layer between the thermally and electrically conductive layer and the GaN mono-crystalline layer.

8. The composite substrate of claim 1, further comprising:
    a reflective layer that is located inside, in a lower portion, or on a bottom surface of the GaN mono-crystalline layer, wherein the bottom surface of the GaN mono-crystalline layer is the interface between the GaN mono-crystalline layer and the thermally and electrically conductive layer.

9. The composite substrate of claim 8, wherein the reflective layer is a metallic reflective layer located on the bottom surface of the GaN mono-crystalline layer, or a periodic structure layer having a grating structure or a photonic lattice structure, located inside or in the lower portion of the GaN mono-crystalline layer.

10. The composite substrate of claim 1, further comprising:
    a bonding layer on the thermally and electrically conductive layer, wherein the reflective layer is on the bonding layer, and wherein the GaN mono-crystalline layer is on the reflective layer.

* * * * *